United States Patent [19]

Haraszti et al.

[11] 4,220,970
[45] Sep. 2, 1980

[54] CIRCUIT ARRANGEMENT FOR IDENTIFYING TELEVISION SIGNALS

[75] Inventors: Ibolya Haraszti, Heilbronn; Peter Lackner, Talheim; Willy Minner, Schwaigern, all of Fed. Rep. of Germany

[73] Assignee: Licentia Patent-Verwaltungs-G.m.b.H., Fed. Rep. of Germany

[21] Appl. No.: 856,975

[22] Filed: Dec. 2, 1977

[30] Foreign Application Priority Data

Dec. 3, 1976 [DE] Fed. Rep. of Germany ....... 2654847

[51] Int. Cl.² .................. H04N 7/08; H04N 5/44; H04N 5/19; H04N 5/44
[52] U.S. Cl. .................. 358/147; 358/191.1; 358/160; 358/188
[58] Field of Search .............. 358/142, 147, 160, 188, 358/191–194

[56] References Cited

U.S. PATENT DOCUMENTS

| | | | |
|---|---|---|---|
| 3,436,471 | 4/1969 | Mounts et al. | 358/142 |
| 3,493,674 | 2/1970 | Houghton | 358/147 |
| 3,610,817 | 10/1971 | Bridgewater | 358/193 |
| 4,079,419 | 3/1978 | Siegel et al. | 358/193 |
| 4,127,821 | 11/1978 | Okada et al. | 358/91 |
| 4,127,822 | 11/1978 | Mogi et al. | 358/91 |

FOREIGN PATENT DOCUMENTS

| | | |
|---|---|---|
| 1591753 | 10/1969 | Fed. Rep. of Germany . |
| 1932936 | 4/1970 | Fed. Rep. of Germany . |
| 2429595 | 1/1975 | Fed. Rep. of Germany . |
| 2347160 | 3/1975 | Fed. Rep. of Germany . |
| 2402233 | 7/1975 | Fed. Rep. of Germany . |

*Primary Examiner*—Stuart N. Hecker
*Assistant Examiner*—Aristotelis M. Psitos
*Attorney, Agent, or Firm*—McGlew and Tuttle

[57] ABSTRACT

The circuitry is used, for identifying television transmitters, in a television set receiving synchronizing signals and line flyback pulses characteristic of television transmitters, particularly for television receivers including a station finder circuit. The circuitry, during the time period of the line flyback pulses, derives samples of those signals appearing above the black level of the video signal, from the demodulated input signal. The number of amplitude jumps determined during the time period of the line flyback pulses is utilized as the criterion for identification of a television transmitter. The signals appearing above the black level of the video signal are inverted and then combined, in an AND circuit, with the line flyback pulses, and the output of the AND circuit is connected to a digital counter circuit to supply the output pulses thereto as counting pulses, with the flyback pulses being supplied to the digital counter circuit as gate pulses. An inverter is connected to the output of the counter circuit and a logic "1" potential appears at the output of the inverter only in the case where a single pulse has been delivered to the counter circuit during the gate time, with a logic "0" potential appearing at the output of the inverter in all other cases. The output of the inverter is connected, through an integrating circuit, to a threshold circuit providing an output signal which indicates whether a television transmitter has been identified.

6 Claims, 7 Drawing Figures

CIRCUIT ARRANGEMENT FOR IDENTIFYING TELEVISION SIGNALS

FIELD AND BACKGROUND OF THE INVENTION

This invention relates to circuitry, in a television receiver, for identifying television transmitters and, more particularly, to an improved circuitry for distinguishing between incoming signals from a television transmitter and other signals, such as an interfering signal or an unmodulated carrier.

In television practice, the necessity frequently arises of determining whether a received signal is a television signal or another signal, for example, an interfering signal or an unmodulated carrier. For this purpose, so-called transmitter identification circuits are needed. The determination of the presence of a television signal is important, for example, in television receivers which are tunable by means of an automatic station finder. That is, the finder action is to be stopped only if a television signal is received, while a stopping of the finder action at other signals, which are not television signals, is not wanted.

Station finder circuits operating with a transmitter identification circuit are already known. In a circuitry disclosed in German Auslegeschrift No. 1,762,321, the sync pulses serve as a criterion, in a manner such that they are supplied, through an oscillating circuit having a resonance frequency higher or lower than the recurrence frequency of the sync pulses, and through a limiting stage, to a frequency discriminator which is responsive to a frequency intermediate the frequency of the oscillating circuit and the recurrence frequency of the sync pulses. The intended result is that noise signals cannot cause disturbances in an automatic station finder and thus there is provided the possibility of "capturing" even faint transmitting stations with the finder. In this prior art circuitry, "noise" produces, for example, a negative voltage, while, in the presence of sync pulses, a positive voltage is obtained which is utilized for switching and, thereby, for stopping the finder.

In another television transmitter identifying circuitry, known from German Auslegeschrift No. 2,426,388, an identification signal is produced by determining and evaluating the width, spacing, and frequency of the vertical sync pulses. Additionally, the following criteria may be used for identifying television transmitters: the amplitude of the control voltage; determination of whether the line sync pulses are in phase with the line flyback pulses; or determination of whether the sound carrier is spaced from the video carrier by the nominal interval of 5.5 MHz. As to the control voltage amplitude, it should be noted that, with the use of up-to-date integrated circuits for the video intermediate frequency (for example, TDA 440), this amplitude (AVC) varies very little, wherefore, it is hardly suitable for determining the presence of a signal from a transmitter.

Experience has shown that the prior art circuit arrangements, for identifying television transmitters by means of the mentioned criteria, still do not meet all requirements. In particular, their disadvantage is that they interrupt the hunting in the vicinity of a signal or assumed signal and check, only after this interruption, whether or not the signal is a television signal. The result is that the station finding process is relatively slow. Even though the above cited German AS No. 1,762,321 makes possible a relatively fast hunting, that disclosure has the disadvantage that filtering arrangements with resonance circuits are needed for discriminating the signals or noise components. Aside from the relatively very expensive circuitry, the further drawback of this design is that it is impossible, or possible only with extremely high expenditures, to embody such filtering arrangements with resonance circuits as monolithic integrated circuits. The integration of circuits, however, is generally desirable at the present time.

SUMMARY OF THE INVENTION

The present invention is directed to a circuitry for identifying television transmitters, which is capable of being manufactured as an integrated circuit and which permits a rapid checking of the incoming signals.

The circuitry, or circuit arrangement, is provided in a television set receiving synchronizing signals and line flyback pulses characteristic of television transmitters, particularly in a television receiver including a transmission finder circuit. During the time period of the line flyback pulses, samples of the signals appearing above the "black level" of the video signal are derived from the demodulated incoming signal, and the number of amplitude jumps, determined during the time period of the line flyback pulses, is taken as a criterion for television transmitter identification.

In accordance with the invention, samples of the signals appearing above the black level of the video signal are derived from the demodulated video signal during the time period of the line flyback pulses. The number of the amplitude jumps determined within each signal sample is the criterion for the identification of the television transmitter. Now, the presence of an amplitude jump means that the signal of a television transmitter is being received. In all other instances, no television transmitter is concerned, only, for example, interferences, an amplitude-modulated carrier, or also a frequency-modulated carrier.

The invention makes it possible to find a station relatively rapidly, in an advantageous manner. That is, during the hunting, even before the video signal has reached its ideal position, the inventive transmitter identifying circuitry can determine whether the signal involved is a television signal, another signal, a disturbing station, or only a circuitry noise. Further, the invention permits a quite satisfactory identification of transmitters, without requiring filtering arrangements with resonance circuits, so that the transmitter identifying circuitry is suitable for a monolithic integration.

Various advantageous developments of the invention will appear from the following description.

An object of the invention is to provide an improved circuitry for identifying television transmitters.

Another object of the invention is to provide such an improved circuitry which is capable of being manufactured as an integrated circuit.

A further object of the invention is to provide such an improved circuitry which permits a rapid checking of the incoming signals to a television receiver.

Yet another object of the invention is to provide such an improved circuitry which is particularly useful with television receivers including station-finder circuits.

For an understanding of the principles of the invention, reference is made to the following description of a typical embodiment thereof as illustrated in the accompanying drawings:

DESCRIPTION OF THE PREFERRED EMBODIMENT

Figure 1:
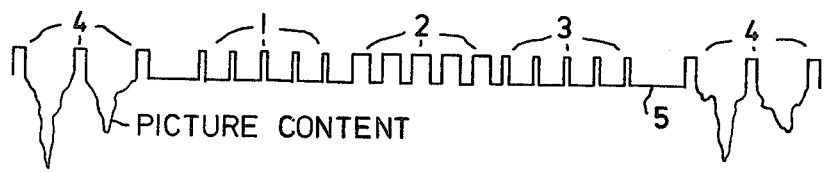
FIG. 1 shows a portion of a composite signal modulated in accordance with the CCIR standard, after the video detection.

FIG. 1 shows a portion of a composite video signal, modulated in accordance with the CCIR standard, as it appears after the video detection, comprising the line sync pulses 4, pre-equalizing pulses 1, post-equalizing pulses 3, and field sync pulses 2. The mentioned pulses, which appear above the black level 5 of the video signal, are also commonly referred to as sync signals. The respective picture content proper appears between the line pulses 4.

Figure 2:
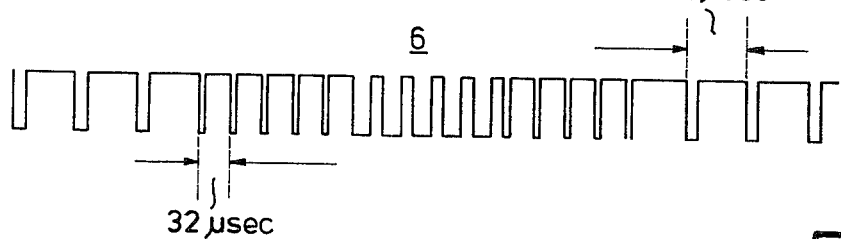
FIG. 2 shows the inverted sync signals, projecting in FIG. 1 above the black level, as they appear at the output of circuit section 12 of the circuitry shown in FIG. 4 or 5.

The pulse sequence shown in FIG. 2 is obtained after the sync signals of FIG. 1 are separated and inverted. This is effected in circuit sections 11 and 12 of the transmitter identifying circuitry shown in FIGS. 4 and 5. The pulse sequence shown in FIG. 2 appears at the output of circuit section 12.

Figure 3:
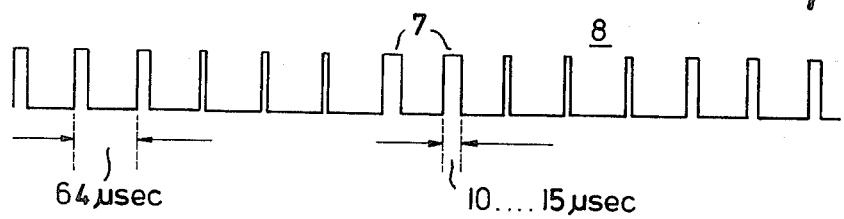
FIG. 3 shows a signal sequence resulting from a combination of the line flyback pulses with the signals according to FIG. 2, as it appears at the output of circuit section 13 of the circuitry shown in FIG. 4 or 5.

FIG. 3 shows a pulse sequence 8 resulting from a combination, in an AND circuit, of pulse sequence 6, shown in FIG. 2, with the line flyback pulses. This combination is effected in a circuit section 13 of the already mentioned circuitry according to FIGS. 4 and 5.

Figure 4:
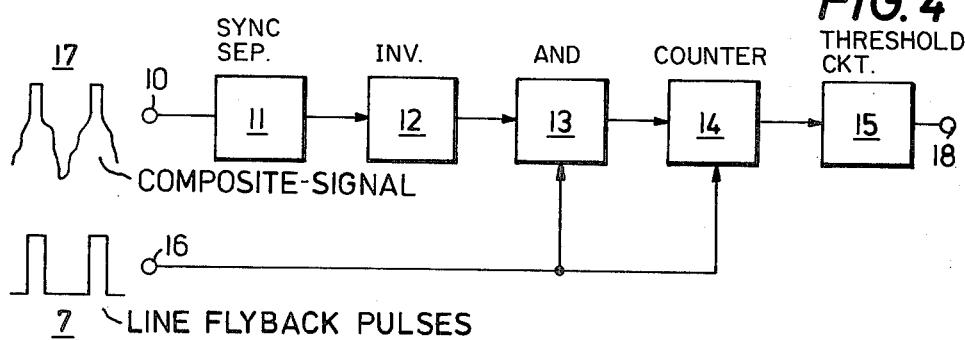
FIG. 4 is a block diagram of a transmitter identifying circuitry embodying the invention.
Figure 5:
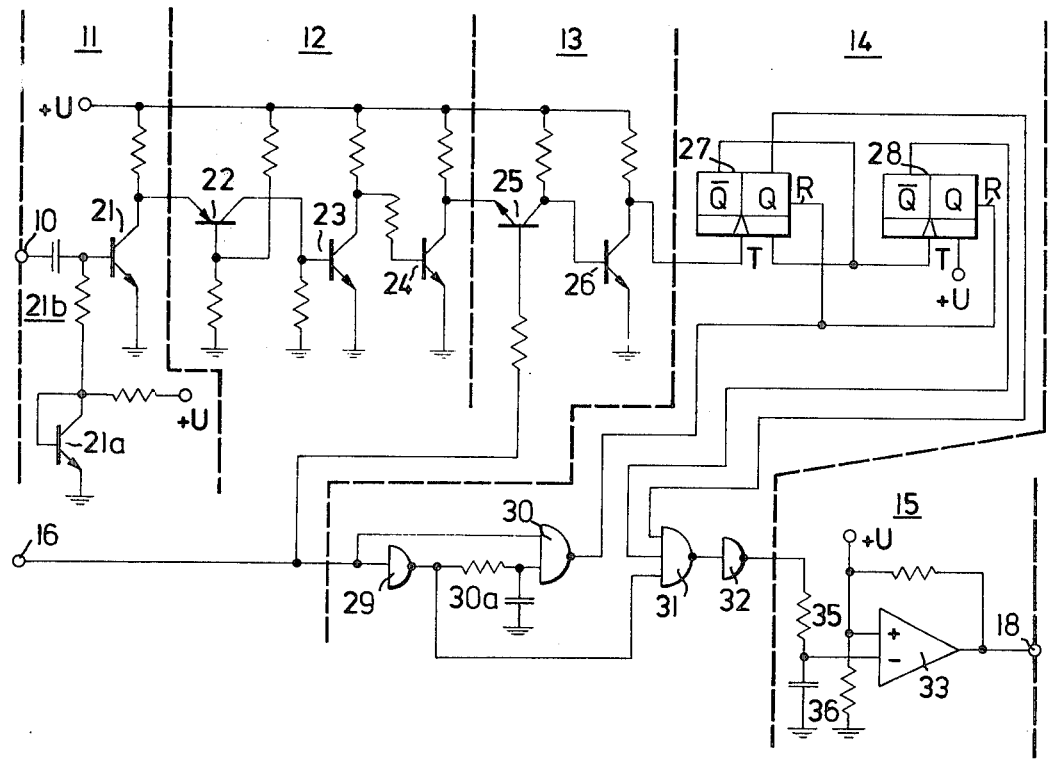
FIG. 5 is a circuit diagram corresponding to the block diagram of FIG. 4.

The following explanation refers to the circuit arrangement for identifying transmitters, shown in FIG. 4 as a block diagram and in FIG. 5 as a circuit diagram. The video signal 17 is supplied through an input terminal 10 to a separator circuit 11. In separator circuit 11, there is produced, by means of a diode-like-connected transistor 21a and an RC network 21b, a bias voltage, in accordance with the grid detection principle, for a transistor 21 whose collector is connected, through a load resistor, to a positive operating voltage +U. In separator circuit 11, the picture content is thereby separated from the sync signals. Separator circuit 11 is followed by an inverter circuit 12 including transistors 22, 23 and 24. In inverter circuit 12, the signals furnished by separator circuit 11 are processed so that the already mentioned pulse sequence shown in FIG. 2 is obtained.

The output signals of inverter circuit 12 are supplied to an AND circuit 13 comprising transistors 25 and 26. AND circuit 13 is also supplied with the line flyback pulses 7 through an input terminal 16. As may be learned from FIG. 3, AND circuit 13 produces an output signal only if both a line flyback pulse and a signal furnished by the inverter circuit 12 are present.

AND circuit 13 is followed by a counter circuit 14 which is formed by two D-flip-flops 27, 28 (for example, TL 7474). The two flip-flops 27 and 28 have timing inputs T, reset inputs R, and outputs Q and $\overline{Q}$. The Q output of flip-flop 27 and the $\overline{Q}$ output of flip-flop 28 are supplied to respective inputs of a triple NAND gate 31, to the third input of which the line flyback pulses 7, inverted in an inverter 29, are supplied. By means of inverter 29, an RC network 30a, and a double NAND gate 30, it is obtained that counter circuit 14 is reset upon each line flyback pulse, so that the counting, by circuit 14, of the pulses delivered from AND circuit 13 (cf. FIG. 3) periodically recommences.

Figure 6:
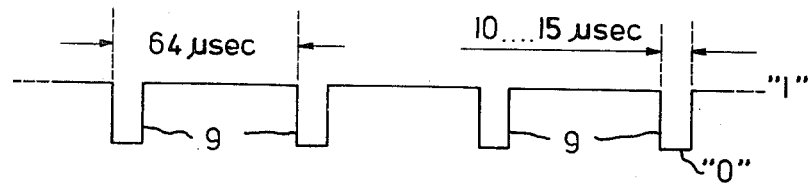
FIG. 6 shows the output pulses of a counting circuit 14.

Thus, virtually, the line flyback pulses 7 are applied to counter circuit 14 as gate pulses, and the output pulses of AND circuit 13 are applied thereto as counting pulses. Counter circuit 14 determines how many pulses were present within the gate time. If a video signal modulated with sync pulses is received, as shown in FIGS. 1 to 3, only a single counting pulse is present within a single gate period (10 to 15 $\mu$sec) and the output of counter circuit 14, i.e., the output of an inverter 32 following NAND gate 31 and timed by the gate time, assumes the logic "1" potential. The pulse sequence 9 thereby produced at the output of counter circuit 14 is shown in FIG. 6.

If now, with the station finder in operation, merely a noise is present at the tuned location, not a single one, but more than one counting pulses appear within the mentioned gate time so that the output of counter circuit 14 remains at the logic "0" potential. Should an AM-modulated or FM-modulated carrier be present within the tuning range, the output of counter circuit 14 also remains at the "0" potential. Even with an AM-modulated carrier where the AM modulation does not correspond approximately to the line frequency, the output of counter circuit 14 substantially remains at the "0" potential. In this way, as described above, the circuitry determines how many amplitude jumps were present within the time period of the line flyback pulse. The number of detected amplitude jumps is the criterion for the television transmitter identification. The presence of a single amplitude jump means that a television signal has been received. In all other instances, thus if no amplitude jump or more amplitude jumps are present within the time period of the line flyback pulse, the received signal is not a television signal.

In order to obtain a switching signal from the inventive circuitry to be delivered, for example, to a station finder circuit, for interrupting the hunting operation if actually a television signal has been received, the output signal of counter circuit 14 (see FIG. 6) is supplied to a threshold circuit 15. This circuit includes an integrating circuit 35, 36 which is followed by an amplifier circuit 33. Amplifier circuit 33 has a trigger threshold 20 (cf. FIG. 7), so that a logic "0" potential appears at output 18 of threshold circuit 15 only if the voltage at the output of integrating circuit 35, 36 has exceeded trigger threshold 20. If the voltage at integrating circuit 35, 36 and, thereby, at the output of amplifier circuit 33, is below trigger threshold 20, output 18 is at the "1" potential. The logic "1" level at output 18 means that no television signal is present, while the logic "0" level indicates that the received signal is a television signal.

This is explained in more detail in the following, with reference to FIG. 7.

Let it be assumed that a television receiver is tuned by means of an automatic station finder. FIG. 7 above shows a frequency spectrum indicating that the hunting operation of the finder may start at 470 MHz. Below the frequency spectrum, the variation of the voltage U1 supplied to amplifier circuit 33 from integrating circuit 35, 36 is plotted, as it varies in the course of the finder tuning operation. Let it be further assumed that, at 485.25 MHz, a television transmitter is in operation. Before this location is reached, voltage U1 at integrating circuit 35, 36 has already exceeded trigger threshold 20, whereby the potential at output 18 (FIG. 5) changes from "1" to "0". During further tuning beyond point 485.25 MHz, voltage U1 drops to a value below trigger threshold 20, so that the potential "1" reappears at output 18. Even with a supposed interfering carrier at 525 MHz, voltage U1 remains below the trigger threshold, since, at the output of counter circuit 14, the "0" potential is present. As the next television transmitter at 569.25 MHz is reached, trigger threshold 20 is again exceeded, so that voltage U2 at outlet 18 again changes from "1" to the "0" potential. Integrating circuit 35, 36 is dimensioned so that voltage U1 exceeds trigger threshold 20 after about eighteen derived signal samples (cf. pulses 9 in FIG. 6, with a television signal present).

Figure 7:
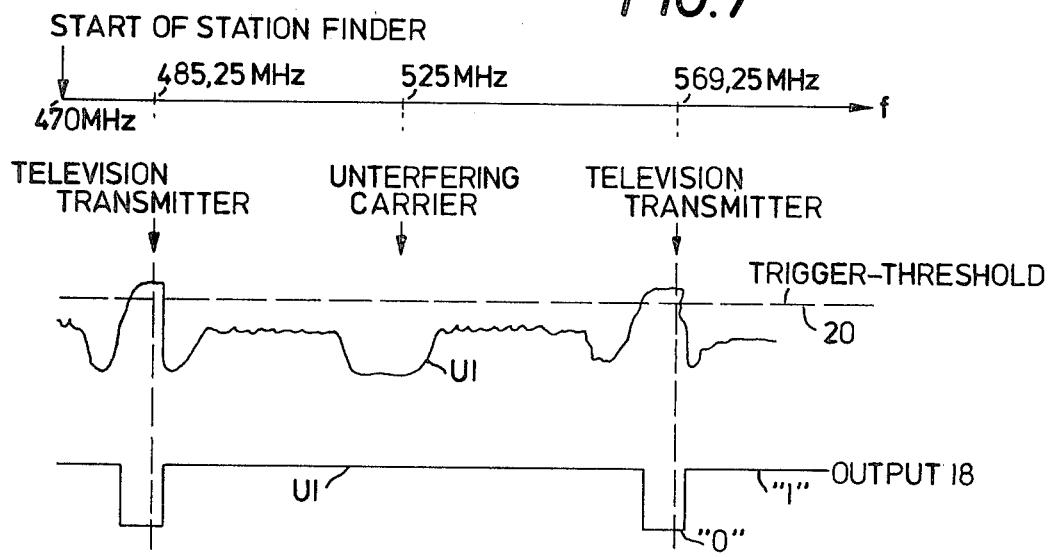
FIG. 7 shows, from the top downwardly, a frequency spectrum, the voltage variation appearing, during an assumed hunting, at the output of an integrating circuit shown in FIG. 5, and the voltage at the output of a threshold circuit 15 following the integrating circuit.

FIG. 7 shows that the decision whether or not a television signal is present is made already about 3-4.5 MHz before the picture carrier has reached its ideal position, namely, as soon as the picture carrier enters the IF selectivity curve. Taking into account that the line synchronization is effected in a relatively short period of time, as with the modern horizontal-combination integrated circuits (for example, TBA 920, 940 or 950) which make it possible within some milliseconds, and that the control of the tuner and the image intermediate frequency takes only a relatively short response time so that a compression of sync pulses is avoided, the inventive transmitter identifying circuitry makes it possible to identify television signals quite satisfactorily at a hunting rate of 60-100 MHz per second. For example, the UHF range of 470-860 MHz may be swept within 4-7 seconds, and the VHF-band-III range of 170-250 MHz within one second.

While a specific embodiment of the invention has been shown and described in detail to illustrate the application of the principles of the invention, it will be understood that the invention may be embodied otherwise without departing from such principles.

What is claimed is:

1. In a television set to which incoming television signals and other signals may be applied and demodulated, said television set comprising line flyback pulse supply means, a circuit arrangement for identifying the television signals, said circuit arrangement being connected to said line flyback supply means and comprising synchronizing pulse separating means to derive, from the demodulated incoming signal during the time period of a line flyback pulse, a sample of a signal having an amplitude within the range of synchronizing signal components of a television signal, and means responsive to amplitude jumps in said sample during the time period of a line flyback pulse to determine the number of such jumps during said time period as a criterion for the identification of an incoming television signal, said means responsive to amplitude jumps comprising, an AND circuit connected to said synchronizing pulse separating means and to said line flyback pulse supply means, a digital counter circuit connected to the output of said AND circuit to receive the output pulses of said AND circuit as counting pulses, and means supplying the flyback pulses to said digital counter circuit as gate pulses therefor.

2. The invention, as claimed in claim 1, in which said counter circuit comprises two flip-flops and a NAND gate; said NAND gate having respective inputs connected to the outputs of said two flip-flops; means supplying inverted line flyback pulses to a further input of said NAND gate; and an inverter connected to the output of said NAND gate.

3. The invention, as claimed in claim 2, in which said counter circuit is designed so that a logic "1" potential appears at the output of said inverter only if a single pulse has been delivered to said counter circuit during the gate time thereof, and a logic "0" potential appears at the output of said inverter in all other instances.

4. The invention, as claimed in claim 3, including a threshold circuit; and an integrating circuit connecting the output of said inverter to the input of said threshold circuit; the output signal of said inverter indicating whether or not a television transmitter has been identified.

5. The invention, as claimed in claim 4, in which said integrating circuit is designed so that, approximately after eighteen individual signal samples confirming the presence of a television transmitter, the output voltage of said integrating circuit exceeds the trigger threshold of said threshold circuit; the presence of a television transmitter being indicated by a logic "1" signal at the output of said inverter.

6. A circuit arrangement for identifying a television transmitter signal having synchronizing pulses and line flyback pulses, in a television set for receiving and demodulating the signal comprising: a separator circuit section (11) for receiving the demodulated signal and for separating the synchronizing pulses therefrom; an inverter circuit section (12) for receiving the synchronizing pulses and inverting them; an AND circuit section having two inputs and an output, with one input connected to said inverter circuit section for receiving the inverted synchronizing pulses and the other input for receiving the line flyback pulses; a counter circuit section (14) for detecting a single simple amplitude jump in the signal during a line flyback pulse connected to said AND circuit section output and having a counter output; and a threshold circuit section (15) connected to said counter output for producing a transmitter identifying signal as soon as a single simple amplitude jump is detected in said counter circuit section during a line flyback pulse.

* * * * *